(12) United States Patent
Luo et al.

(10) Patent No.: US 11,450,599 B2
(45) Date of Patent: Sep. 20, 2022

(54) SEMICONDUCTOR COMPONENT

(71) Applicant: REALTEK SEMICONDUCTOR CORPORATION, Hsinchu (TW)

(72) Inventors: Cheng-Wei Luo, Hsinchu (TW); Chieh-Pin Chang, Hsinchu (TW); Kai-Yi Huang, Hsinchu (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 9 days.

(21) Appl. No.: 17/144,183

(22) Filed: Jan. 8, 2021

(65) Prior Publication Data
US 2021/0217695 A1     Jul. 15, 2021

(30) Foreign Application Priority Data
Jan. 14, 2020   (TW) .................. 109101156

(51) Int. Cl.
| | |
|---|---|
| H01L 27/08 | (2006.01) |
| H01L 21/44 | (2006.01) |
| H01L 23/522 | (2006.01) |
| H01L 23/528 | (2006.01) |
| H01L 27/01 | (2006.01) |
| H01L 49/02 | (2006.01) |
| H01F 27/28 | (2006.01) |

(52) U.S. Cl.
CPC ..... H01L 23/5221 (2013.01); H01F 27/2804 (2013.01); H01L 23/528 (2013.01); H01L 27/01 (2013.01); H01L 28/10 (2013.01)

(58) Field of Classification Search
CPC ............. H01L 23/5221; H01L 23/5227; H01F 27/2804

USPC ........................ 438/131–132, 600–601, 615; 257/528–531, 21.022
See application file for complete search history.

(56) References Cited

U.S. PATENT DOCUMENTS

| | | | |
|---|---|---|---|
| 2015/0341014 A1 | 11/2015 | Wang et al. | |
| 2019/0237238 A1* | 8/2019 | Yen | ........................ H01F 19/04 |
| 2019/0279809 A1* | 9/2019 | Yen | ...................... H01F 27/2823 |
| 2020/0343335 A1* | 10/2020 | Yen | ...................... H01F 17/0013 |

FOREIGN PATENT DOCUMENTS

| | | | | |
|---|---|---|---|---|
| CN | 111863779 A | * | 10/2020 | ............. H01F 27/28 |
| TW | 201933386 A | | 8/2019 | |

OTHER PUBLICATIONS

OA letter of the counterpart TW application (appl. No. 109101156) dated Aug. 19, 2020 Summary of the OA letter: Claims 1-10 are rejected under Taiwan Patent Law Article 22(2) as being unpatentable over reference 1 (TW201933386A).

* cited by examiner

*Primary Examiner* — Calvin Lee
(74) *Attorney, Agent, or Firm* — WPAT, PC

(57) ABSTRACT

An integrated circuit is provided. The integrated circuit includes a first trace, a second trace and a third trace. The first trace, the second trace and the third trace are each a continuous trace. The first trace, the second trace and the third trace together use only two conductor layers of a semiconductor structure. In a crossing area of the first trace, the second trace and the third trace, the first trace crosses the second trace once, the first trace crosses the third trace once, and the second trace crosses the third trace once.

12 Claims, 8 Drawing Sheets

SEMICONDUCTOR COMPONENT

BACKGROUND OF THE INVENTION

1. Field of the Invention

The present invention generally relates to semiconductor components, and, more particularly, to wiring structures of semiconductor components.

2. Description of Related Art

FIG. 1 is a semiconductor structure, which includes, from bottom to top in the vertical direction (z direction), a substrate 110, an oxide layer 120, a metal layer 130, an oxide layer 135 and a metal layer 140. The metal layer 130 may be the ultra-thick metal (UTM) layer, and the metal layer 140 may be the re-distribution layer (RDL). The oxide layer 120 may include other metal layers (not shown). Typically, the resistance of the UTM layer is smaller than the resistance of the RDL, and the resistance of the metal layers in the oxide layer 120 is about tens of times the resistance of the UTM layer.

Crossed traces are common in semiconductor components, and multiple metal layers are necessary to implement the crossed traces. FIG. 2 shows a partial wiring structure of a conventional semiconductor component. The trace 210, the trace 220 and the trace 230 cross one another. The trace 210 is in the upper metal layer (e.g., the metal layer 140 in FIG. 1), the trace 220 is in the middle metal layer (e.g., the metal layer 130 in FIG. 1), and the trace 230 is in the lower metal layer (e.g., the metal layer in the oxide layer 120 in FIG. 1). Since the resistance of the metal layer in the oxide layer 120 is relatively high, the trace 230 must be relatively wide to withstand high currents. However, wider traces are accompanied by larger parasitic capacitors or capacitance, resulting in poor electrical characteristics of the semiconductor component.

SUMMARY OF THE INVENTION

In view of the issues present in the prior art, an object of the present invention is to provide a semiconductor component which uses fewer conductor layers, so as to make an improvement to the prior art.

A semiconductor component is provided. The semiconductor component includes a first trace, a second trace and a third trace. The first trace includes a first segment, a second segment, and a third segment which are coupled in sequence. The second trace includes a fourth segment, a fifth segment, a sixth segment, a seventh segment, and an eighth segment which are coupled in sequence. The third trace includes a ninth segment, a tenth segment, and an eleventh segment which are coupled in sequence. The first segment, the fourth segment, and the ninth segment are substantially parallel, and the third segment, the eighth segment, and the eleventh segment are substantially parallel. The second segment crosses the tenth segment and the seventh segment, and the fifth segment crosses the tenth segment. Each of the first trace, the second trace, and the third trace is continuous.

A semiconductor component is also provided. The semiconductor component includes a first trace, a second trace and a third trace. Each of the first trace, the second trace and the third trace is continuous. The first trace, the second trace and the third trace use only two conductor layers of a semiconductor structure. In a crossing area of the first trace, the second trace and the third trace, the first trace and the second trace cross once, the first trace and the third trace cross once, and the second trace and the third trace cross once.

A semiconductor device is also provided. The semiconductor device has a layered structure including a first layer, a second layer and a third layer. The semiconductor device includes a first trace, a second trace and a third trace. The first trace extends from the first layer to the third layer and includes a first continuous segment which is arranged between the first layer and the third layer but does not belong to the first layer and the third layer. The second trace extends from the second layer through the third layer to the second layer and includes a second continuous segment which does not belong to the first layer and the second layer. The third trace extends from the third layer to the first layer and includes a third continuous segment which is arranged between the first layer and the third layer but does not belong to the first layer and the third layer. Each of the first trace, the second trace and the third trace is continuous. The first trace, the second trace and the third trace use only two conductor layers of a semiconductor structure. The first continuous segment crosses the second continuous segment and the third continuous segment, and the second continuous segment crosses the third continuous segment.

A semiconductor component is also provided. The semiconductor component includes a first trace, a second trace, a third trace and a fourth trace. Each of the first trace, the second trace, the third trace and the fourth trace is continuous. The first trace, the second trace, the third trace and the fourth trace use only two conductor layers of a semiconductor structure. In a crossing area of the first trace, the second trace, the third trace and the fourth trace, the first trace and the second trace cross once, the first trace and the third trace cross once, the first trace and the fourth trace cross once, the second trace and the fourth trace cross once, and the third trace and the fourth trace cross once.

According to the present invention, the semiconductor component requires only a few conductor layers for wiring. In comparison with the conventional technology, the semiconductor components fabricated according to the present invention are better in characteristics because they use a wiring structure so well designed that the avoidance of using a high-resistance conductor layer is possible.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

Figure 1:
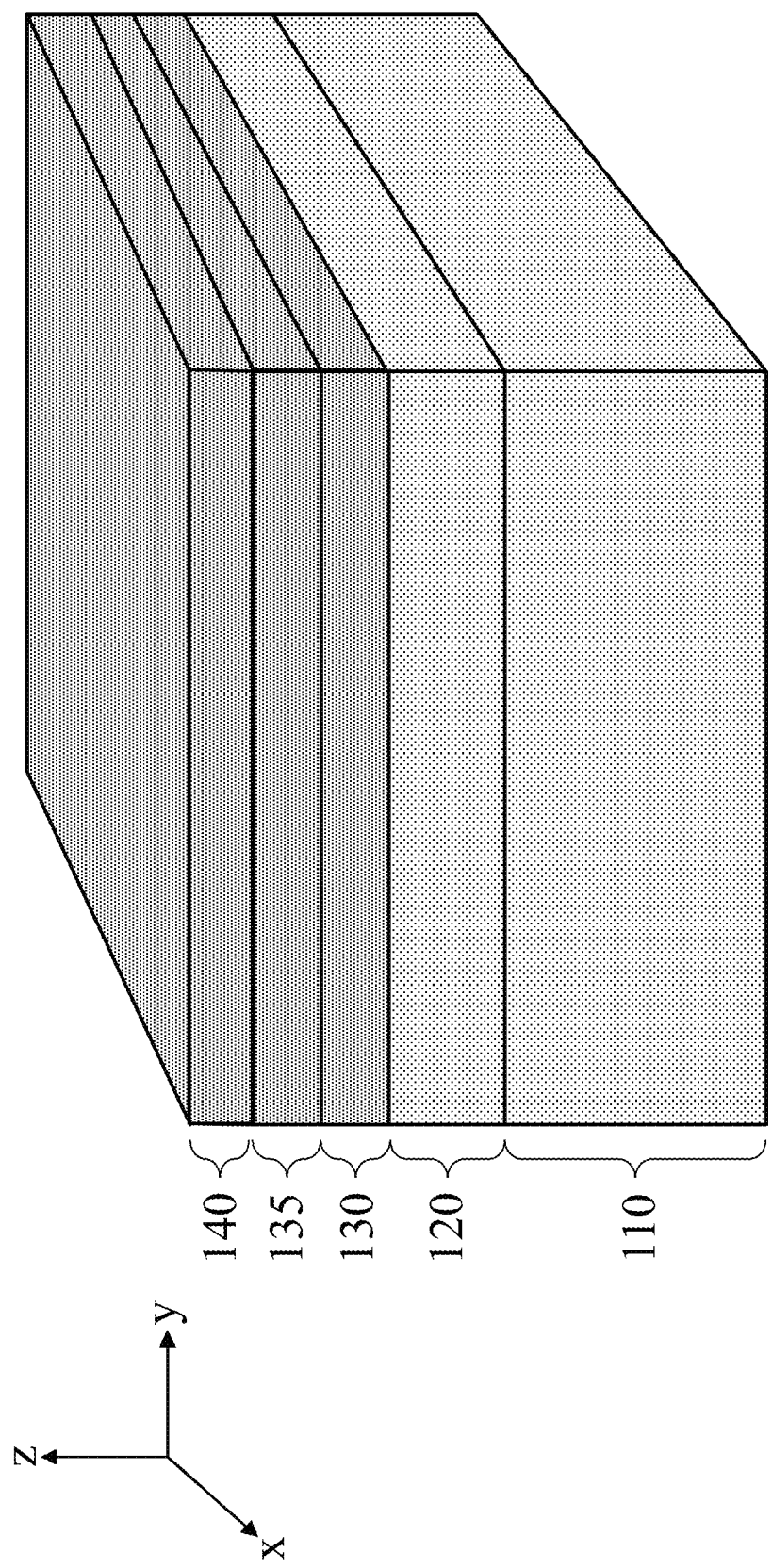
FIG. 1 shows a semiconductor structure.
Figure 2:
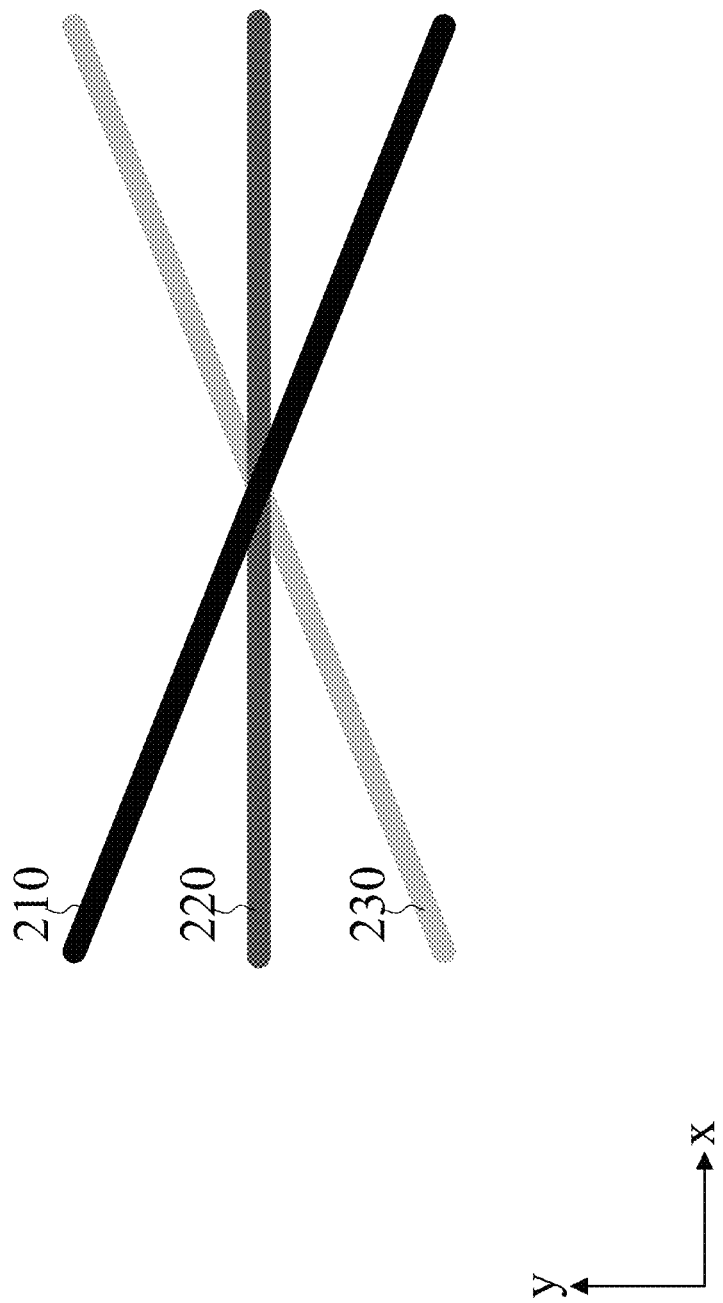
FIG. 2 is a partial wiring structure of a conventional semiconductor component.

The following description is written by referring to terms of this technical field. If any term is defined in this specification, such term should be interpreted accordingly.

The disclosure herein includes semiconductor components. On account of that some or all elements of the semiconductor components could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present invention, which means that the scope of this invention is not limited to the embodiments in the specification.

Although the terms "first," "second," etc., may be used herein to describe various elements, these elements should not be limited by these terms. Rather, these terms are only used to distinguish one element from another. For example, a first element could be termed a second element, and, similarly, a second element could be termed a first element, without departing from the scope of the embodiments.

Throughout the drawings and the detailed description, the same reference numerals refer to the same or similar elements.

Figure 3:
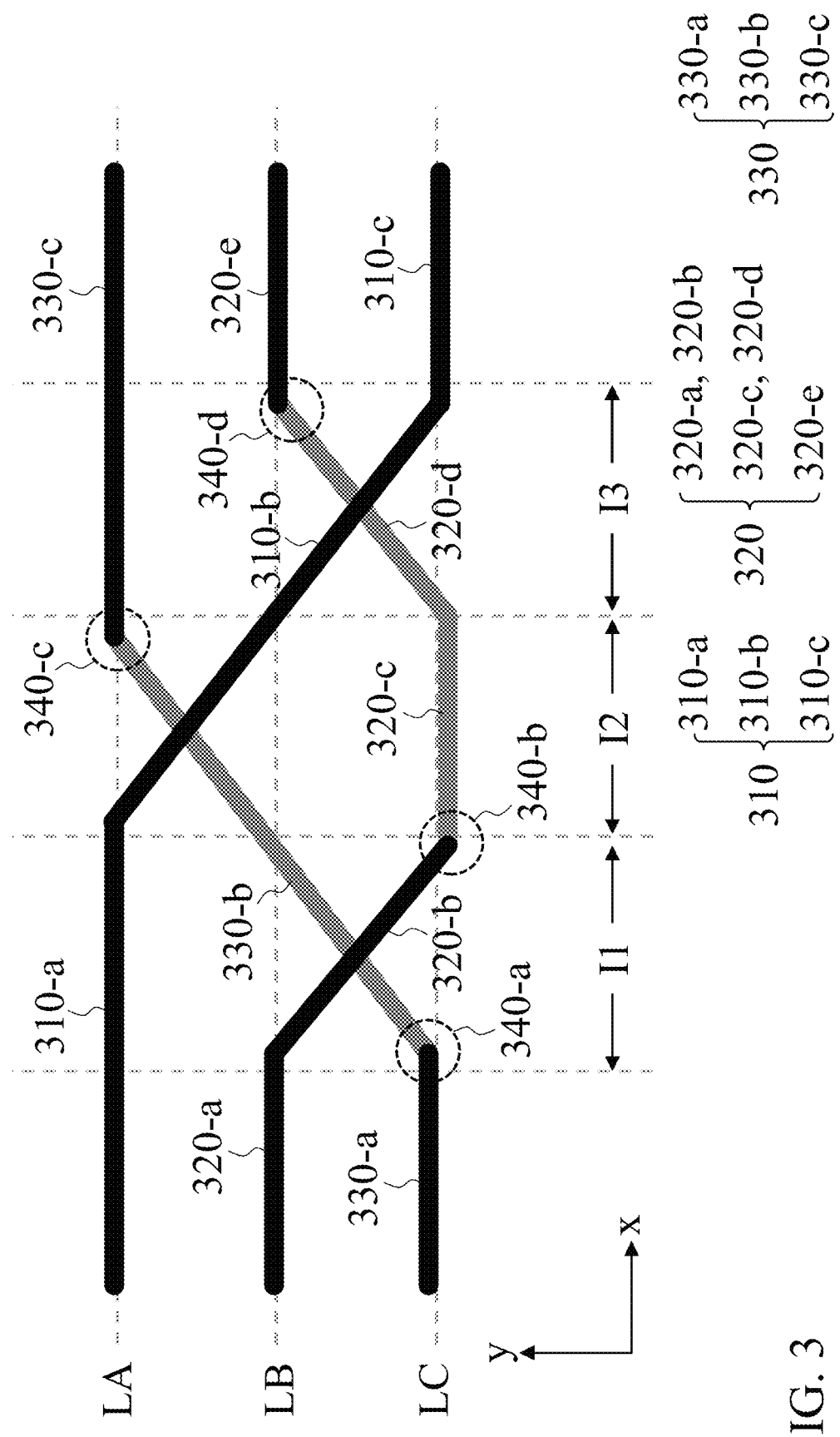
FIG. 3 is a partial wiring structure of a semiconductor component according to an embodiment of the present invention.

FIG. 3 shows a partial wiring structure of a semiconductor component according to an embodiment of the invention. FIG. 3 is a top view of the semiconductor component. The partial wiring structure of the semiconductor component includes a trace 310 (including a segment 310-*a*, a segment 310-*b* and a segment 310-*c* connected in sequence), a trace 320 (including a segment 320-*a*, a segment 320-*b*, a segment 320-*c*, a segment 320-*d* and a segment 320-*e* connected in sequence), and a trace 330 (including a segment 330-*a*, a segment 330-*b* and a segment 330-*c* connected in sequence). In FIG. 3, the black segments are implemented in the first conductor layer of the semiconductor structure, and the gray segments are implemented in the second conductor layer of the semiconductor structure. The first conductor layer may be one of the UTM layer and the RDL, and the second conductor layer may be the other. The segments in different conductor layers are connected by through structures (e.g., vias or via arrays) on the through positions 340-*a*, 340-*b*, 340-*c* and 340-*d*. As a result, although each trace (the trace 310, 320 or 330) may include segments in more than one conductor layer, each trace is continuous.

As shown in FIG. 3, the semiconductor component of the present invention is a layered structure on the x-y plane which includes the layer LA, the layer LB and the layer LC. The segment 310-*a* and the segment 330-*c* are arranged in the layer LA, and an extension of the segment 310-*a* passes through the segment 330-*c*, and vice versa. The segment 320-*a* and the segment 320-*e* are arranged in the layer LB, and an extension of the segment 320-*a* passes through the segment 320-*e*, and vice versa. The segment 330-*a* and the segment 310-*c* are arranged in the layer LC, and the extension of the segment 330-*a* passes through the segment 310-*c*, and vice versa.

The segment 310-*b* is a continuous segment connecting the segment 310-*a* and the segment 310-*c*. The segment 310-*b* is arranged between the layer LA and the layer LC but does not belong to the layer LA and the layer LC. The segment 320-*b*, the segment 320-*c* and the segment 320-*d* together form a continuous segment connecting the segment 320-*a* and the segment 320-*e*, and the continuous segment (i.e., the segment 320-*b*, the segment 320-*c* and the segment 320-*d*) does not belong to the layer LA and the layer LB. The segment 330-*b* is a continuous segment connecting the segment 330-*a* and the segment 330-*c*. The segment 330-*b* is arranged between the layer LA and the layer LC but does not belong to the layer LA and the layer LC.

There are three sections (I1, I2 and I3, collectively, the crossing area) in FIG. 3, and the portions of the trace 310, the trace 320 and the trace 330 outside the crossing area are substantially parallel to each other. More specifically, the segment 310-*a*, the segment 320-*a* and the segment 330-*a* are substantially parallel to each other, and the segment 330-*c*, the segment 320-*e* and the segment 310-*c* are substantially parallel to each other. In the crossing area, the trace 310 and the trace 320 cross once, the trace 310 and the trace 330 cross once, and the trace 320 and the trace 330 cross once. More specifically, after entering the crossing area, the trace 320 first traces in the section I1 along the segment 320-*b* to the segment 320-*c*, which is in the section I2 and belongs to the layer LC, and then traces in the section I3 along the segment 320-*d* to the segment 320-*e*, which belongs to the layer LB. After entering the crossing area, the trace 330 traces along the segment 330-*b* to the segment 330-*c*. In the section I1, the segment 320-*b* crosses the segment 330-*b* (i.e., the trace 320 crosses the trace 330). After entering the crossing area, the trace 310 first extends for a certain distance (i.e., the length of the section I1) and then traces along the segment 310-*b* to the segment 310-*c*. In the section I2, the segment 310-*b* crosses the segment 330-*b* (i.e., the trace 310 crosses the trace 330), and, in the section I3, the segment 310-*b* crosses the segment 320-*d* (i.e., the trace 310 crosses the trace 320).

As shown in FIG. 3, the semiconductor component of the present invention uses only two conductor layers in the semiconductor structure to implement the crossings of three traces. With this structure, the semiconductor component need not use the conductor layer of higher resistance. Therefore, the characteristics of semiconductor components can be improved.

Figure 4:
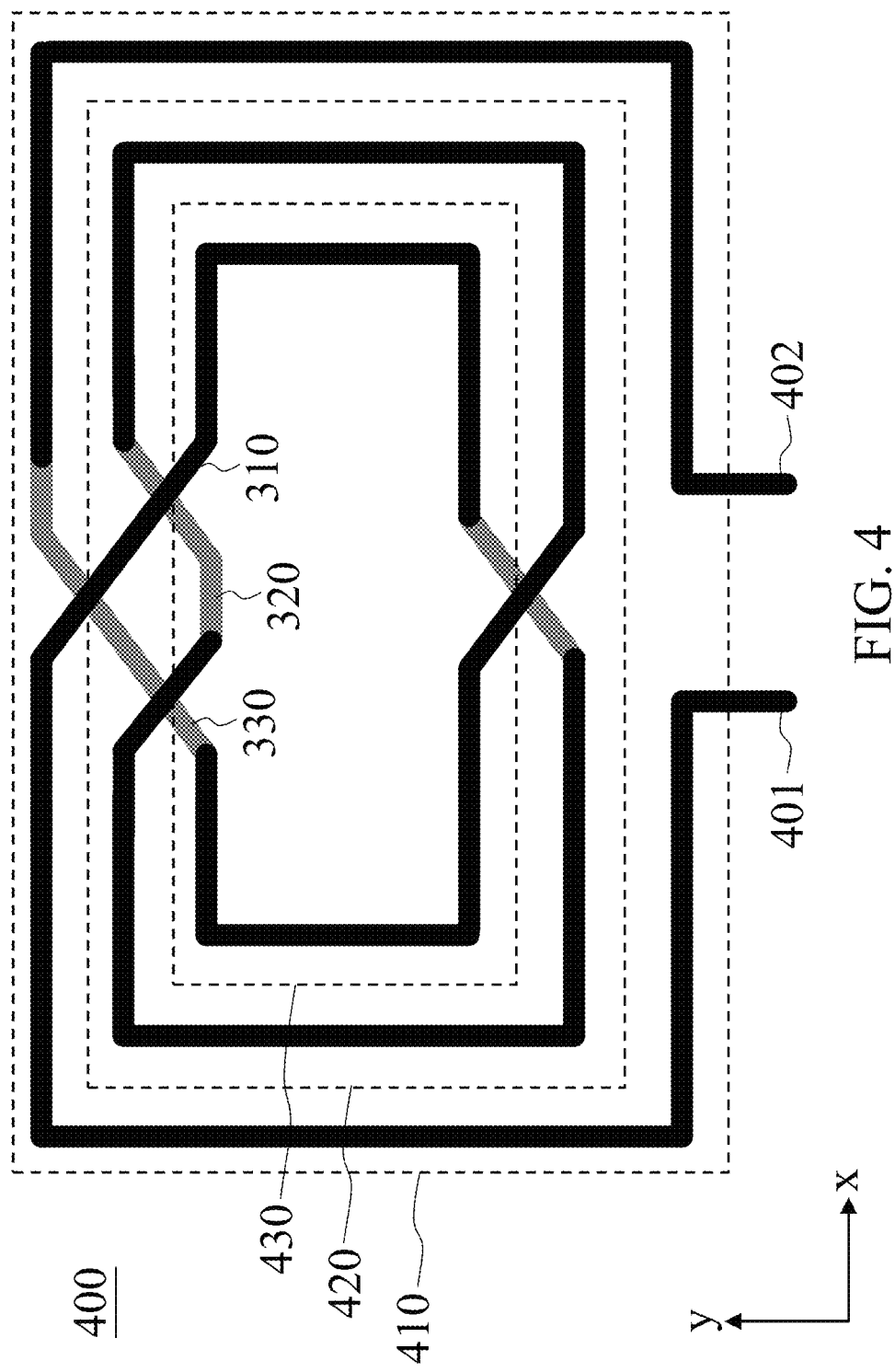
FIG. 4 is an illustrative structure of a semiconductor component according to an embodiment of the present invention.

FIG. 4 is an illustrative structure of a semiconductor component according to an embodiment of the present invention. The semiconductor component 400 is a three-turn inductor (i.e., the semiconductor component 400 is a layered structure) and includes an end 401 and an end 402. The segments between the dotted box 410 and the dotted box 420 belong to the first turn of the inductor, the segments between the dotted box 420 and the dotted box 430 belong to the second turn of the inductor, and the segments inside the dotted box 430 belong to the third turn of the inductor. The second turn is arranged between the first turn and the third turn. Reference is made to both FIG. 3 and FIG. 4. When the wiring structure of FIG. 3 is applied to the semiconductor component 400, the trace 310 connects the first turn and the third turn of the semiconductor component 400, the trace 330 connects the third turn and the first turn of the semiconductor component 400, and the trace 320 connects the second turn of the semiconductor component 400. In other words, the layer LA corresponds to the first turn of the semiconductor component 400, the layer LB corresponds to the second turn of the semiconductor component 400, and the layer LC corresponds to the third turn of the semiconductor component 400.

Figure 5:
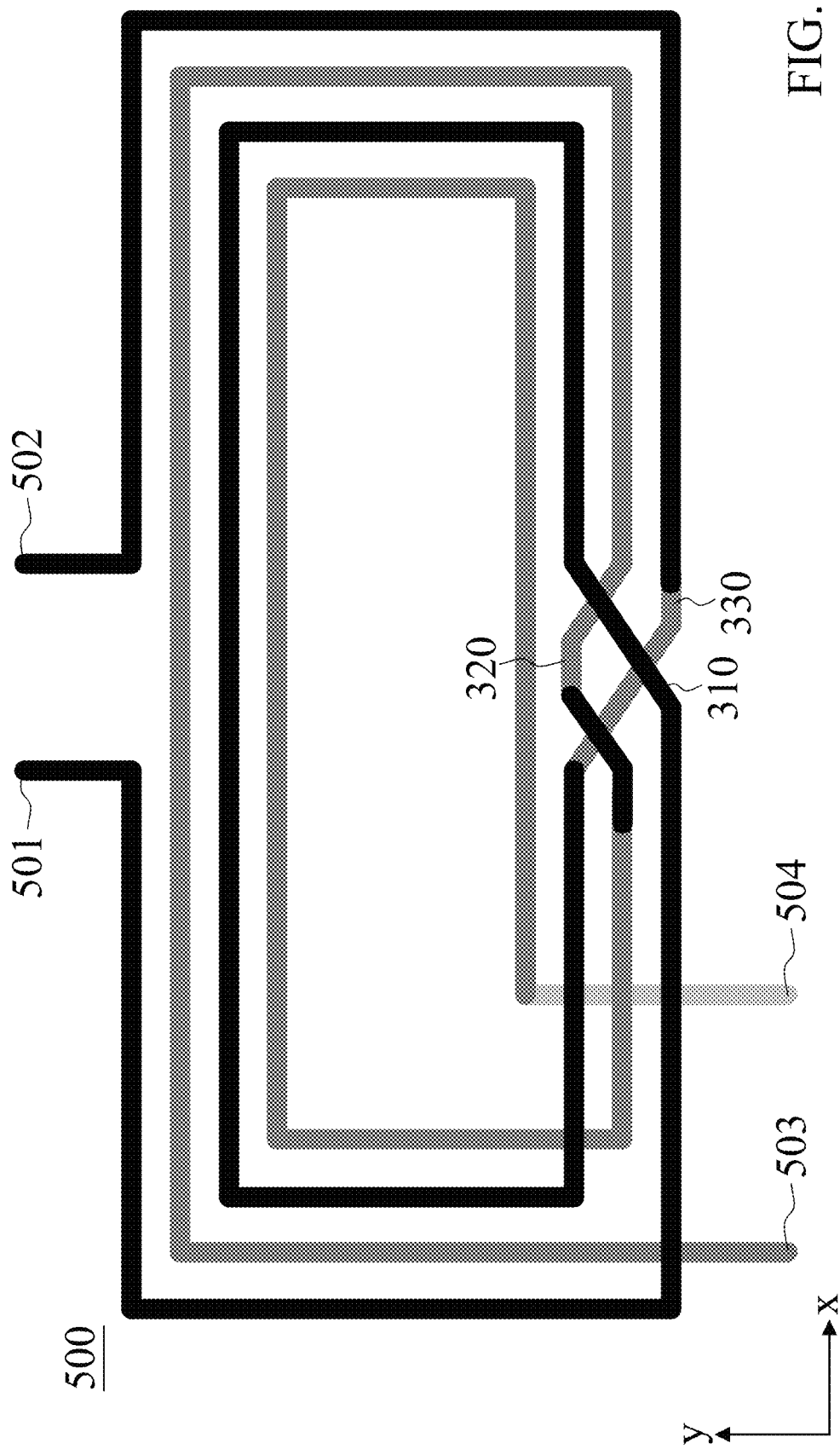
FIG. 5 is an illustrative structure of a semiconductor component according to another embodiment of the present invention.

FIG. 5 is an illustrative structure of a semiconductor component according to another embodiment of the present invention. The semiconductor component 500 is a transformer which is made up of a first inductor and a second inductor. The first inductor uses the end 501 and the end 502 as its two ends, and the second inductor uses the end 503 and the end 504 as its two ends. The semiconductor component 500 includes a first turn, a second turn, a third turn and a fourth turn sequentially arranged from outside to inside. In other words, the semiconductor component 500 is a layered structure. The first and third turns belong to the first inductor, while the second and fourth turns belong to the second inductor. In FIG. 5, the black segments are implemented in the first conductor layer of the semiconductor structure, the dark gray segments are implemented in the second conductor layer of the semiconductor structure, and the light gray segment directly connected to the end 504 is implemented in the third conductor layer of the semiconductor structure. The third conductor layer is different from the first conductor layer and the second conductor layer.

Reference is made to both FIG. 3 and FIG. 5. When the wiring structure of FIG. 3 is applied to the semiconductor component 500, the trace 310 connects the first and third turns of the semiconductor component 500 (i.e., connecting the outer turn and the inner turn of the first inductor), the trace 320 connects the second turn of the semiconductor component 500 (i.e., connecting to the outer turn of the second inductor), and the trace 330 connects the first and third turns of the semiconductor component 500 (i.e., connecting the outer turn and the inner turn of the first inductor). In other words, the layer LA corresponds to the first turn of the semiconductor component 500, the layer LB corresponds to the second turn of the semiconductor component 500, and the layer LC corresponds to the third turn of the semiconductor component 500.

Figure 6:
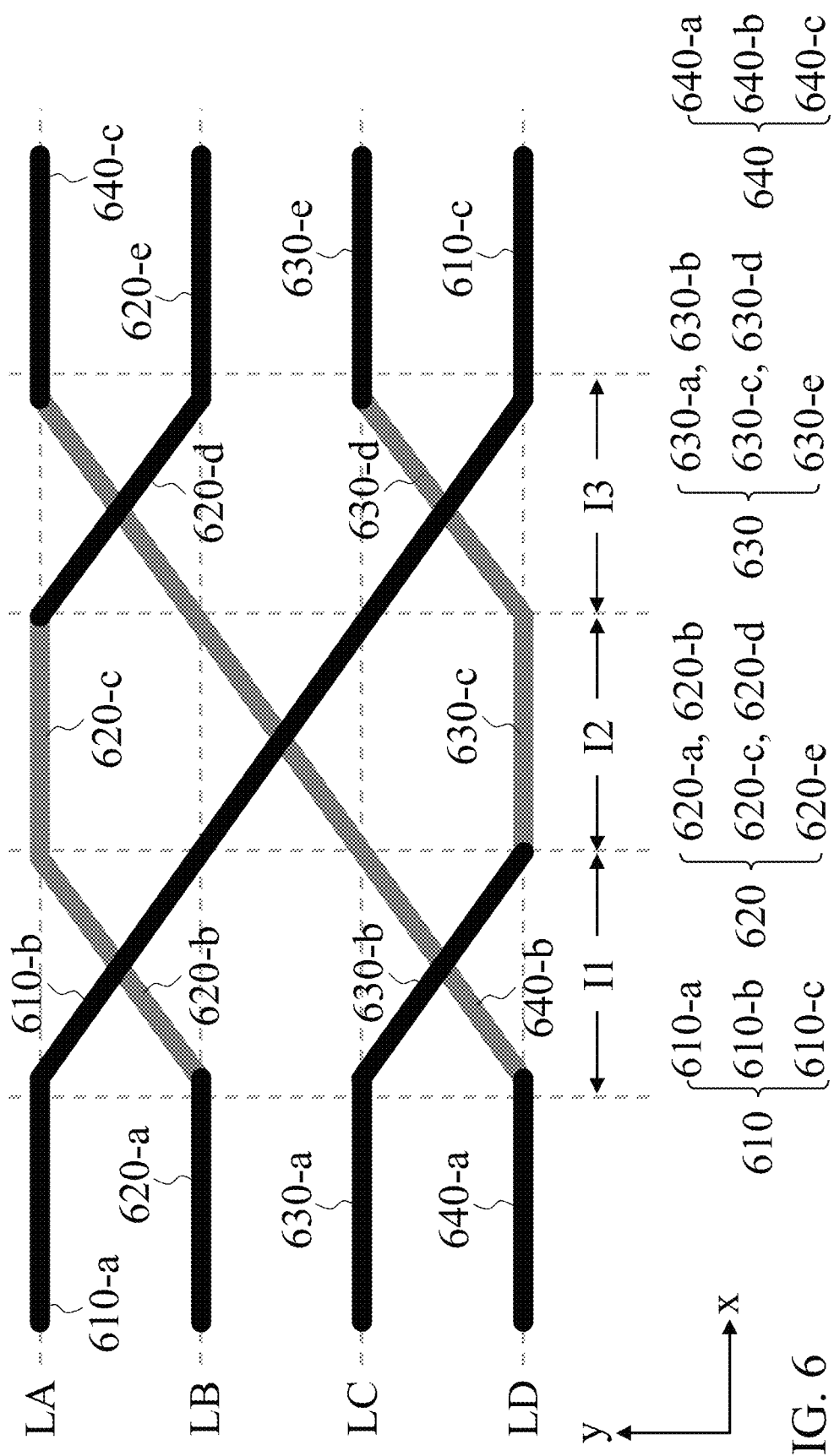
FIG. 6 is a partial wiring structure of a semiconductor component according to another embodiment of the present invention.

FIG. 6 shows a partial wiring structure of a semiconductor component according to another embodiment of the present invention. FIG. 6 is a top view of the semiconductor component. The partial wiring structure of the semiconductor component includes a trace 610 (including a segment 610-*a*, a segment 610-*b* and a segment 610-*c* connected in sequence), a trace 620 (including a segment 620-*a*, a segment 620-*b*, a segment 620-*c*, a segment 620-*d* and a segment 620-*e* connected in sequence), a trace 630 (including a segment 630-*a*, a segment 630-*b*, a segment 630-*c*, a segment 630-*d* and a segment 630-*e* connected in sequence), and a trace 640 (including a segment 640-*a*, a segment 640-*b* and a segment 640-*c* connected in sequence). Although each trace (the trace 610, 620, 630, or 640) may include segments in more than one conductor layer, each trace is continuous.

As shown in FIG. 6, the semiconductor component of the present invention is a layered structure on the x-y plane which includes the layer LA, the layer LB, the layer LC and the layer LD. The segment 610-*a* and the segment 640-*c* are arranged in the layer LA, and an extension of the segment 610-*a* passes through the segment 640-*c*, and vice versa. The segment 620-*a* and the segment 620-*e* are arranged in the layer LB, and an extension of the segment 620-*a* passes through the segment 620-*e*, and vice versa. The segment 630-*a* and the segment 630-*e* are arranged in the layer LC, and an extension of the segment 630-*a* passes through the segment 630-*e*, and vice versa. The segment 640-*a* and the segment 610-*c* are arranged in the layer LD, and an extension of the segment 640-*a* passes through the segment 610-*c*, and vice versa.

The segment 610-*b* is a continuous segment connecting the segment 610-*a* and the segment 610-*c*. The segment 610-*b* is arranged between the layer LA and the layer LD but does not belong to the layer LA and the layer LD. The segment 620-*b*, the segment 620-*c* and the segment 620-*d* together form a continuous segment connecting the segment 620-*a* and the segment 620-*e*, and the continuous segment (i.e., the segments 620-*b*, 620-*c* and 620-*d*) does not belong to the layer LB, the layer LC and the layer LD. The segment 630-*b*, the segment 630-*c* and the segment 630-*d* together form a continuous segment connecting the segment 630-*a* and the segment 630-*e*, and the continuous segment (i.e., the segments 630-*b*, 630-*c* and 630-*d*) does not belong to the layer LA, the layer LB and the layer LC. The segment 640-*b* is a continuous segment connecting the segment 640-*a* and the segment 640-*c*. The segment 640-*b* is arranged between the layer LA and the layer LD but does not belong to the layer LA and the layer LD.

There are three sections (I1, I2 and I3, collectively, the crossing area) in FIG. 6, and the portions of the trace 610, the trace 620, the trace 630 and the trace 640 outside the crossing area are substantially parallel to each other. More specifically, the segment 610-*a*, the segment 620-*a*, the segment 630-*a* and the segment 640-*a* are substantially parallel to each other, and the segment 640-*c*, the segment 620-*e*, the segment 630-*e* and the segment 610-*c* are substantially parallel to each other. In the crossing area, the trace 610 crosses the trace 620, the trace 630 and the trace 640 once, respectively, and the trace 640 crosses the trace 620 and the trace 630 once, respectively. More specifically, after entering the crossing area, the trace 610 traces along the segment 610-*b* to the segment 610-*c*. After entering the crossing area, the trace 620 first traces in the section I1 along the segment 620-*b* to the segment 620-*c*, which is in the section I2 and belongs to the layer LA, and then traces in the section I3 along the segment 620-*d* to the segment 620-*e*, which belongs to the layer LB. After entering the crossing area, the trace 630 first traces in the section I1 along the segment 630-*b* to the segment 630-*c*, which is in the section I2 and belongs to the layer LD, and then traces in the section I3 along the segment 630-*d* to the segment 630-*e*, which belongs to the layer LC. After entering the crossing area, the trace 640 traces along the segment 640-*b* to the segment 640-*c*. In the section I1, the segment 610-*b* crosses the segment 620-*b* (i.e., the trace 610 crosses the trace 620), and the segment 630-*b* crosses the segment 640-*b* (i.e., the trace 630 crosses the trace 640). In the section I2, the segment 610-*b* crosses the segment 640-*b* (i.e., the trace 610 crosses the trace 640). In the section I3, the segment 620-*d* crosses the segment 640-*b* (i.e., the trace 620 crosses the trace 640), and the segment 630-*d* crosses the segment 610-*b* (i.e., the trace 630 crosses the trace 610).

The wiring structure of FIG. 6 uses only two conductor layers in the semiconductor structure. With this structure, the semiconductor component need not use the conductor layer of higher resistance. Therefore, the characteristics of semiconductor components can be improved.

Figure 7:
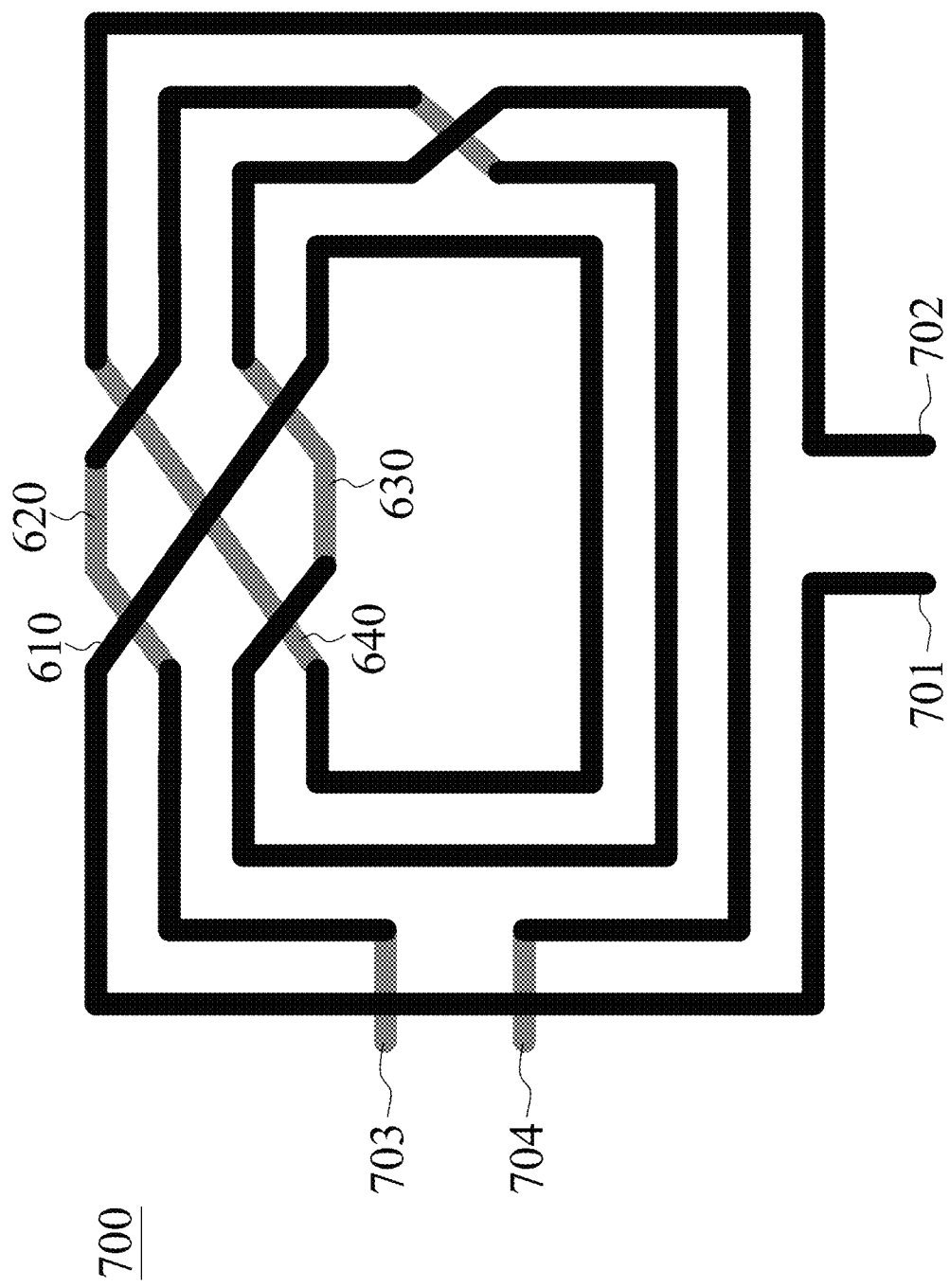
FIG. 7 is an illustrative structure of a semiconductor component according to another embodiment of the invention.

FIG. 7 is an illustrative structure of a semiconductor component according to another embodiment of the invention. The semiconductor component 700 is a transformer which includes a first inductor and a second inductor. The first inductor uses the end 701 and the end 702 as its two ends, and the second inductor uses the end 703 and the end 704 as its two ends. The semiconductor component 700 includes a first turn, a second turn, a third turn and a fourth turn sequentially arranged from outside to inside. In other words, the semiconductor component 700 is a layered structure. The first and fourth turns belong to the first inductor, while the second and third turns belong to the second inductor.

Reference is made to both FIG. 6 and FIG. 7. When the structure of FIG. 6 is applied to the semiconductor component 700, the trace 610 connects the first and fourth turns of the semiconductor component 700 (i.e., connecting the outer turn and the inner turn of the first inductor), the trace 620 connects to the second turn of the semiconductor component 700 (i.e., connecting to the outer turn of the second inductor), the trace 630 connects to the third turn of the semiconductor component 700 (i.e., connecting to the inner turn of the second inductor), and the trace 640 connects the first and fourth turns of the semiconductor component 700 (i.e., connecting the outer turn and the inner turn of the first inductor). In other words, the layer LA corresponds to the first turn of the semiconductor component 700, the layer LB corresponds to the second turn of the semiconductor component 700, the layer LC corresponds to the third turn of the semiconductor component 700, and the layer LD corresponds to the fourth turn of the semiconductor component 700.

Figure 8:
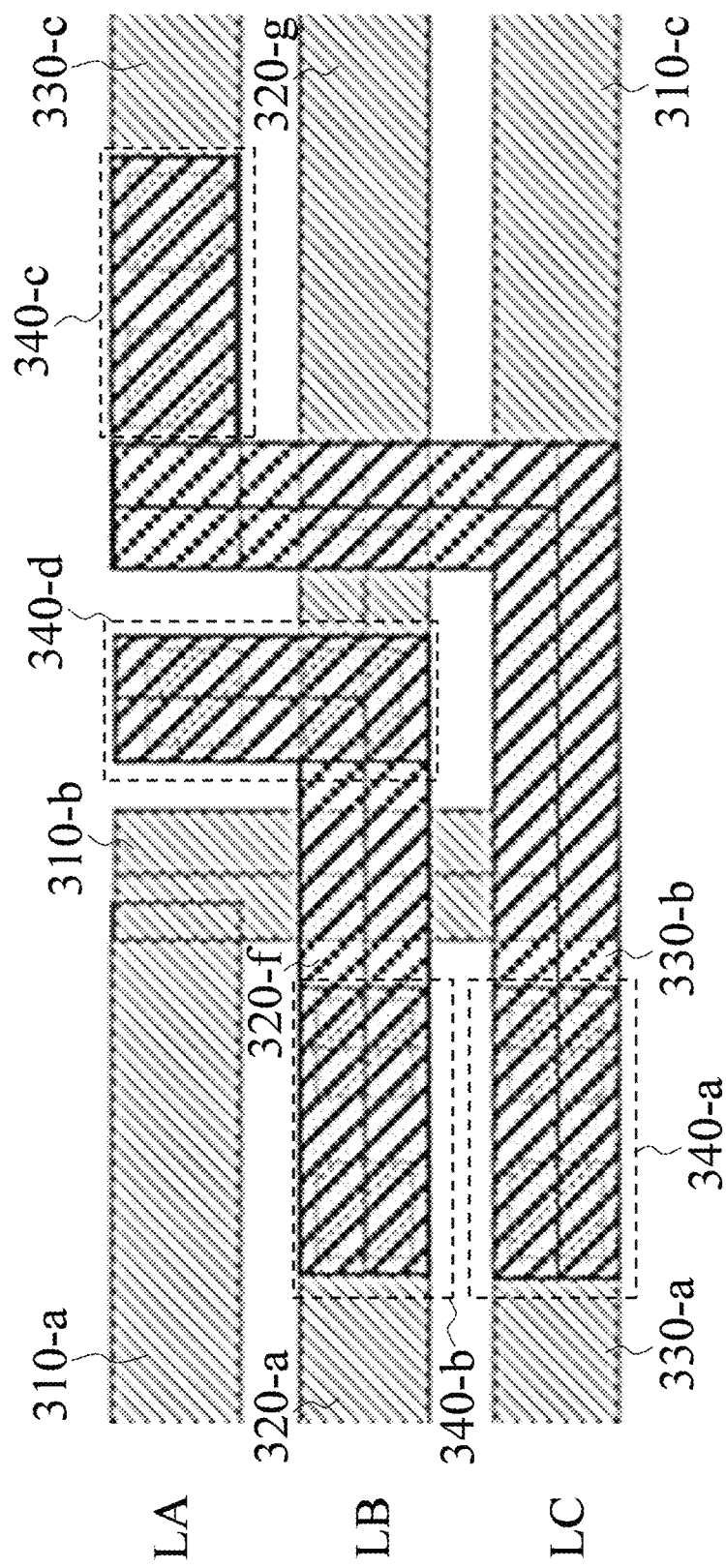
FIG. 8 shows an illustrative structure equivalent to the partial wiring structure of FIG. 3.

FIG. 8 shows an illustrative structure equivalent to the partial wiring structure of FIG. 3. In this embodiment, the segment 320-*f* (the black segment in the upper layer) corresponds to the continuous segment made up of the segment 320-*b* and the segment 320-*c,* and the segment 320-*g* (the gray segment in the lower layer) corresponds to the continuous segment made up of the segment 320-*d* and the segment 320-*e.*

Since a person having ordinary skill in the art can appreciate the implementation detail and the modification thereto of the present method invention through the disclosure of the device invention, repeated and redundant description is thus omitted. Furthermore, the shape, size, ratio, the number of layers and the number of turns of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are consequently viewed as being embraced by the scope of the present invention.

What is claimed is:

1. An integrated circuit, comprising:
a first trace, a second trace and a third trace;
wherein each of the first trace, the second trace and the third trace is continuous;
wherein the first trace, the second trace and the third trace use only two conductor layers of a semiconductor structure;
wherein in a crossing area of the first trace, the second trace and the third trace, the first trace and the second trace cross once, the first trace and the third trace cross once, and the second trace and the third trace cross once;
wherein the integrated circuit is a transformer which includes a first inductor and a second inductor, which includes a first turn, a second turn and a third turn;
wherein the first trace is connecting the first turn and the third turn, the second trace is connecting the second turn, and the third trace is connecting the third turn and the first turn; and
wherein the first trace and the third trace are a part of the first inductor, and the second trace is a part of the second inductor.

2. The integrated circuit of claim 1, wherein the integrated circuit is a transformer which includes a first inductor and a second inductor, the first trace and the third trace being a part of the first inductor, and the second trace being a part of the second inductor.

3. An integrated circuit, comprising:
a first trace including a first segment, a second segment, and a third segment coupled in sequence;
a second trace, including a fourth segment, a fifth segment, a sixth segment, a seventh segment, and an eighth segment coupled in sequence; and
a third trace including a ninth segment, a tenth segment, and an eleventh segment coupled in sequence;
wherein the first segment, the fourth segment, and the ninth segment are substantially parallel, and the third segment, the eighth segment, and the eleventh segment are substantially parallel;
wherein the second segment crosses the tenth segment and the seventh segment, and the fifth segment crosses the tenth segment;
wherein each of the first trace, the second trace, and the third trace is continuous; and
wherein the first segment, the third segment, the fourth segment, the eighth segment, the ninth segment and the eleventh segment are implemented in a same conductor layer.

4. The integrated circuit of claim 3, wherein the integrated circuit is an inductor which includes a first turn, a second turn and a third turn, the first trace connecting the first turn and the third turn, the second trace connecting the second turn, and the third trace connecting the third turn and the first turn.

5. The integrated circuit of claim 3, wherein an extension of the first segment passes through the eleventh segment, an extension of the fourth segment passes through the eighth segment, and an extension of the ninth segment passes through the third segment.

6. The integrated circuit of claim 3, wherein the integrated circuit is a transformer which includes a first inductor and a second inductor, the first trace and the third trace being a part of the first inductor, and the second trace being a part of the second inductor.

7. The integrated circuit of claim 3, wherein the first trace, the second trace and the third trace use only two conductor layers of a semiconductor structure.

8. The integrated circuit of claim 3, wherein the sixth segment is substantially parallel to the first segment.

9. An integrated circuit, comprising:
a first trace including a first segment, a second segment, and a third segment coupled in sequence;
a second trace, including a fourth segment, a fifth segment, a sixth segment, a seventh segment, and an eighth segment coupled in sequence; and
a third trace including a ninth segment, a tenth segment, and an eleventh segment coupled in sequence;
wherein the first segment, the fourth segment, and the ninth segment are substantially parallel, and the third segment, the eighth segment, and the eleventh segment are substantially parallel;
wherein the second segment crosses the tenth segment and the seventh segment, and the fifth segment crosses the tenth segment;

wherein each of the first trace, the second trace, and the third trace is continuous; and wherein the integrated circuit is an inductor which includes a first turn, a second turn and a third turn, the first trace connecting the first turn and the third turn, the second trace connecting the second turn, and the third trace connecting the third turn and the first turn.

10. The integrated circuit of claim 9, wherein an extension of the first segment passes through the eleventh segment, an extension of the fourth segment passes through the eighth segment, and an extension of the ninth segment passes through the third segment.

11. The integrated circuit of claim 9, wherein the first trace, the second trace and the third trace use only two conductor layers of a semiconductor structure.

12. The integrated circuit of claim 9, wherein the sixth segment is substantially parallel to the first segment.

* * * * *